United States Patent [19]

Wong et al.

[11] Patent Number: 4,480,336
[45] Date of Patent: Oct. 30, 1984

[54] ORTHOGONAL HYBRID FIN-LINE MIXER

[75] Inventors: Joseph S. Wong, Upland; Kuo-Ing Chung, Covina; Kenneth A. Rudenauer, Pomona, all of Calif.

[73] Assignee: General Dynamics, Pomona Division, Pomona, Calif.

[21] Appl. No.: 420,444

[22] Filed: Sep. 20, 1982

[51] Int. Cl.³ .............................................. H04B 1/26
[52] U.S. Cl. .................................................. 455/328
[58] Field of Search ............................. 455/325–328, 455/330

[56] References Cited

U.S. PATENT DOCUMENTS

| | | | |
|---|---|---|---|
| 2,516,990 | 8/1950 | Herold | 455/326 |
| 2,909,655 | 10/1959 | Sanner | 455/328 |
| 2,943,192 | 6/1960 | Liss | 455/328 |
| 3,041,452 | 6/1962 | Robertson et al. | 455/326 |
| 3,066,290 | 11/1962 | Whitehorn | 455/328 |
| 3,071,729 | 1/1963 | Schiffman | 455/328 |
| 3,192,489 | 6/1965 | Walker et al. | |
| 3,254,315 | 5/1966 | Lattanzi | 455/326 |
| 3,512,090 | 5/1970 | Mouw | 455/326 |
| 3,652,941 | 3/1972 | Neuf | 455/326 |
| 3,932,815 | 1/1976 | Yuan et al. | 455/326 |
| 4,099,126 | 7/1978 | Hallford | 455/326 |
| 4,270,224 | 5/1981 | Blondel et al. | 455/328 |
| 4,276,655 | 6/1981 | Kraemer et al. | 455/327 |
| 4,291,415 | 9/1981 | Buntschult | 455/328 |

FOREIGN PATENT DOCUMENTS 2925827  1/1981  Fed. Rep. of Germany ...... 455/328

OTHER PUBLICATIONS

"Ku-Band Front-End in Integrated Fin-Line Technique" by Begemann, 1980.
"A Subharmonically Pumped Fin-Line Mixer for Satellite TV Receiver Applications" by Begemann, 6/1981.

Primary Examiner—Jin F. Ng
Attorney, Agent, or Firm—Neil F. Martin; Freling E. Baker; Edward B. Johnson

[57] ABSTRACT

A Ka-band orthogonal hybrid fin-line mixer includes a two-piece housing forming an orthogonal hybrid-T junction having a fin-line mounted within the waveguide E-plane at the output of the orthogonal hybrid-T junction with one-half of the fin-line substrate mounted within the top waveguide housing and the other half inserted within the bottom waveguide housing.

10 Claims, 9 Drawing Figures

ORTHOGONAL HYBRID FIN-LINE MIXER

BACKGROUND OF THE INVENTION

The present invention relates to waveguide hybrids and mixers and pertains particularly to an improved orthogonal hybrid-T fin-line mixer capable of both single- and double-balanced configuration.

Microwave junctions are widely used in radar technology as power dividing, summing and differencing networks. They are used in one form or another in most of the microwave components and subsystems.

Many forms of waveguides and mixers have been developed over the years. Among the waveguide hybrids that have been developed are the orthogonal hybrid-T which has been developed as a more compact structure than a standard magic-T. The orthogonal hybrid-T forms a very compact device and in operation one RF energy is fed into the H-arm while another is fed into the E-arm. Each signal couples through its respective iris into a common cavity where the signal is split equally into two H-plane waveguide outputs. The two output signals have the same phase relationship as that of a magic-T.

The present invention is aimed at providing an improved Ka-band mixer. The mixer should be able to take advantage of low cost printed circuit fabrication technology which is particularly suited to batch processing and which facilitates the use of low parasitic beam lead diodes. Furthermore, simple circuit mounting via split block constructed housing should preclude the need for multiple complex machined parts, thus further reducing fabrication cost as compared to the traditional all waveguide mixer with whisker contacted honeycomb Schottky diodes.

The invention should also lead to fully integrated multifunctional down converters which can readily include a local oscillator, low noise amplifier, antenna, appropriate preselection and postselection filters, or other integrated circuitry which complement the down converter assembly. Integrated receivers using monolithic or millimeter wave integrated circuitry should be under particular attention due to the inherent small size and low production cost. This benefit should offer considerable advantages when mechanizing multichannel receivers for applications where space is a premium.

Thus, the design approach should yield production economy due to ease of manufacturing and should be compatible to microwave and millimeter wave integrated circuit technology using suspended stripline, microstrip, coplanar and slot line where air and metallized dielectric substrate can be the primary media.

SUMMARY AND OBJECTS OF THE INVENTION

It is the primary object of the present invention to provide an improved Ka-band mixer which has low conversion loss and low spurius responses.

Another object of the invention is to be able to utilize printed circuit and low parasitic (i.e. beam lead) diodes.

Another object of the invention is to provide a small mixer by utilizing orthogonal hybrid-T.

Another object of the invention is to be able to provide single- and double-balanced mixer configurations with identical orthogonal hybrid-T.

Another object of the invention is to have a mixer which is biasable by incorporating a biasing network onto the circuit pattern.

A further object of the invention is to have the mixer scalable (i.e. to scale the mixer frequency from Ka-band down to lower bands or up to higher bands until physical limitation for such scalability has been reached).

In a preferred embodiment, the invention is a Ka-band mixer combined with the feature of high performance (i.e. low noise and low spurius responses) and small size. High performance is obtained by utilizing fin-line printed circuit approach so that low noise, low parasitic beam lead Schottky diodes can be used and at the same time small size is achieved by being able to integrate this fin-line into a compact orthogonal hybrid-T. The orthogonal hybrid-T in this case provides the inputs for the LO and RF signals and, after they are properly split, they travel to the two respective H-plane outputs. The fin-line circuit mounted inside the waveguide E-plane at the output of the orthogonal hybrid-T provides the impedance matching, signals mixing and filtering. IF signal is extracted at the IF terminal.

In another embodiment of the invention, both single- and double-balanced mixer configurations can be obtained using the identical orthogonal hybrid-T.

BRIEF DESCRIPTION OF THE DRAWINGS

The above and other objects and advantages of the present invention will become apparent from the following description when read in conjunction with the accompanying drawings wherein.

DETAILED DESCRIPTION OF THE PREFERRED EMBODIMENTS

Figure 1:
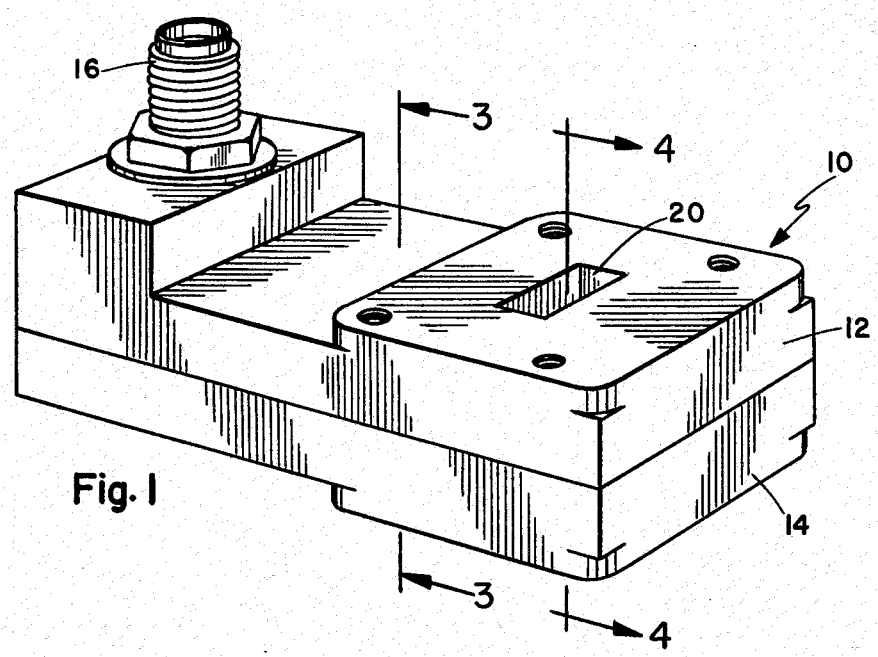
FIG. 1 is a perspective view of the mixer module.

Referring to FIG. 1, a mixer in accordance with the invention designated generally by the numeral 10, includes a housing structure formed of an upper housing 12 and a lower housing 14 and including an IF coaxial terminal 16 extending from the upper housing. The upper and lower housings 12 and 14 are preferably constructed of a conducting metal such as aluminum or a copper alloy. This housing is shaped to form an orthogonal hybrid-T waveguide structure which serves as the basic building block for the mixer. The basic orthogonal hybrid-T junction is fully disclosed in U.S. Pat. No. 3,192,489, issued June 29, 1965 to Walker et al and is fully incorporated herein by reference.

Figure 2:
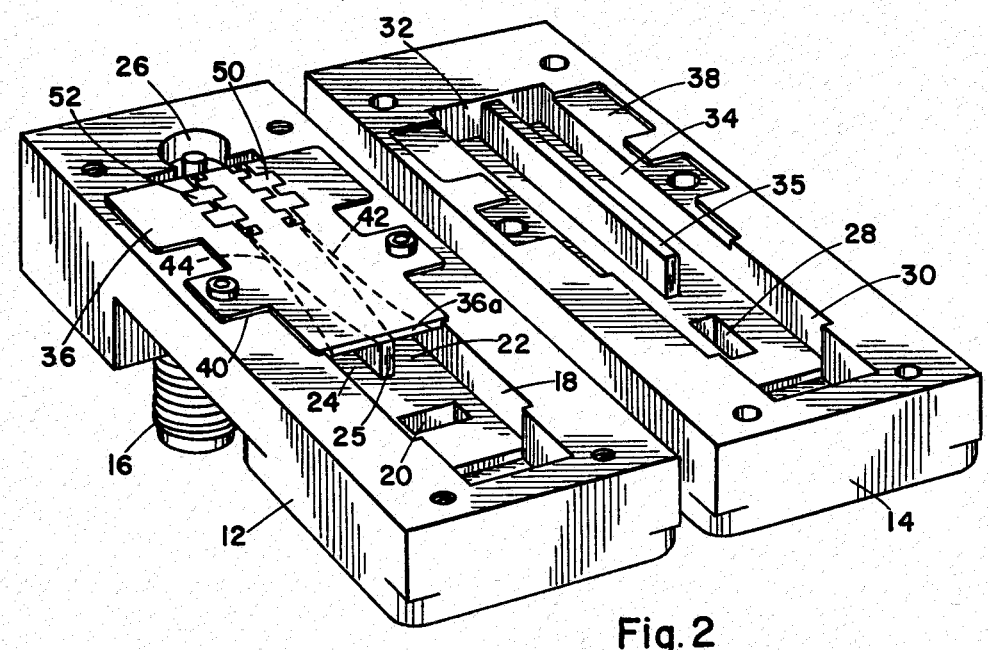
FIG. 2 is a perspective view with the upper portion of the module removed and inverted.
Figure 3:
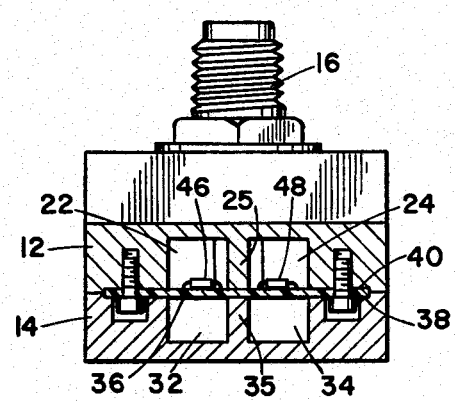
FIG. 3 is a sectional view taken on line 3—3 of FIG. 1.
Figure 4:
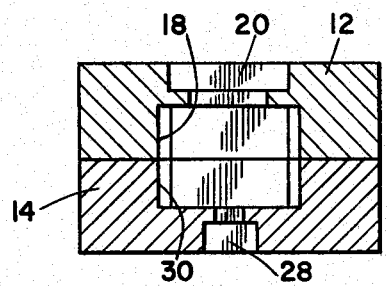
FIG. 4 is a sectional view taken on line 4—4 of FIG. 1.

Referring to FIG. 2, the upper housing 12 forms an upper waveguide assembly including a common cavity 18 with which a first rectangular waveguide or RF signal input port 20 communicates and which communicates with parallel rectangular waveguide channels 22 and 24 separated by a common thin wall 25 forming the upper halves of second and third rectangular waveguide. These communicate with a cavity 26 for the IF terminal output.

The lower housing 14 includes a forth rectangular waveguide or RF signal port 28 communicating with cavity 30 which communicates with parallel waveguide channels 32 and 34 separated by a common thin wall 35 forming the lower half of the second and third rectangular waveguides extending along the length of the housing. The waveguides 20 and 28 are collinear but with the major cross sectional dimension at right angles to one another. These waveguides 20 and 28 are also orthogonal to the two parallel rectangular waveguides 22,32 and 24,34. This construction forms an orthogonal hybrid-T junction.

The hybrid junction has the characteristic that a signal entering at one terminal pair will divide and emerge from the two adjacent terminal pairs, but will not reach the opposite terminal. With the illustrated orthogonal hybrid-T, a signal entering along either guide 20 or 28 will divide equally along guides 22,32 and 24,34 but no signal will be transmitted to the other or opposite guide 20 or 28. The waveguide 20, due to its orientation, is termed the H-plane arm of the guide assembly. The other waveguide 28 is considered the E-plane arm of the unit.

In operation, one RF energy signal is fed into the H-arm while another RF energy is fed into the E-arm. Each signal couples through its respective iris into a common cavity 18, 30 where the signal is split equally into two H-plane wave guide outputs 22,32 and 24,34. The output signals have the same phase relationship as that of a magic-T.

The present invention incorporates a fin-line into the orthogonal hybrid-T junction described above to provide a unique compact device having high performance and low cost. A fin-line substrate 36 is mounted in the center of the E-plane with the substrate 36 fitting one-half within a cutout 38 in the lower housing and one-half in a similar cutout 40 in the upper housing. The front edge 36a of the substrate 36 aligns with the entrance to the output waveguide openings 22,32 and 24,34 and the front edge of the common walls 25 and 35.

Figure 5:
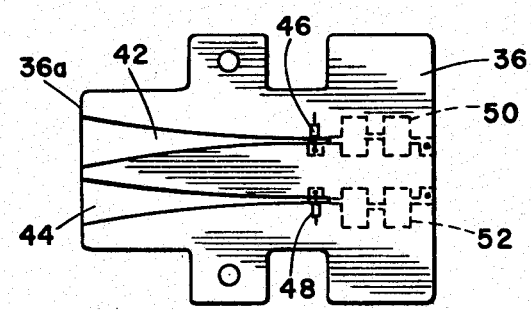
FIG. 5 is a plan view of the underside of the circuit board.

Referring to FIG. 5, a Ka-band fin-line circuit is printed on a thin metallized dielectric substrate. This fin-line substrate has a two-sided printed circuit with a circuit pattern as shown in FIG. 5.

The printed circuit on the top surface as shown in FIG. 5 is made of a conductive material such as copper, silver or the like and is formed with slot transformers 42 and 44 for matching the impedance of the waveguides to the diode impedance. A pair of Schottky diodes 46 and 48 are connected to the circuit by soldering or bonding across the slots to the ground pads. The ground pads are located a quarter wavelength away from the slot transformer's shortcircuited ends. Grounding for the beam-lead diodes is provided by connection through two plated through holes formed in the substrate.

On the bottom side of the substrate is a printed circuit including low pass microstrip filters 50 and 52 with soldered or bonded wire leads connected to the outputs of the low pass filters at one end and to the center conductor of the IF connector at the other end.

A Ka-band fin-line balanced mixer prototype was fabricated and tested in accordance with the present invention. An adjustable short was incorporated into the prototype design so that the center frequency could be set at any part of the 26.5 to 40-GHz band. This setting determines the mixers operating center frequency.

The above described construction provides a common wide band impedance transformation from waveguide to fin-line for both RF and LO signals. In addition, this design is scalable to higher millimeter wave frequencies using low noise, beam lead Schottky barrier diodes.

Figure 6:
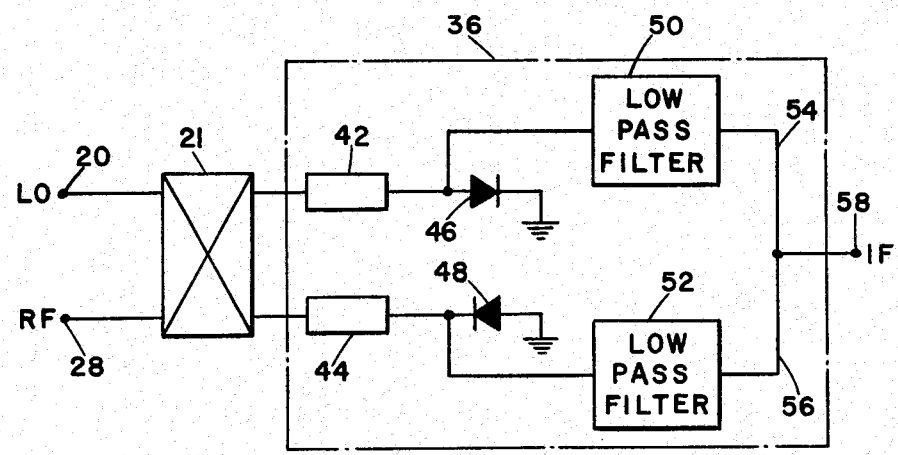
FIG. 6 is a schematic of the fin-line single-balanced mixer.

A schematic of this Ka-band orthogonal hybrid fin-line mixer is illustrated in FIG. 6. The LO and RF frequencies are input to the orthogonal hybrid-T, designated generally by the numeral 21 and the signals matched in impedance by the impedance transformers 42 and 44 to the beam lead diodes 46 and 48 where signals are mixed and IF extracted through the low pass filters 50 and 52 and by bonded wire leads 54 and 56 to the IF output terminal 58. This construction provides a mixer that is very small in size (less than a cubic inch), low cost, and with typical conversion loss of about 6-dB.

In operation, two signals to be mixed are applied to waveguides or ports 20 and 28. The two signals may be, for example, a radio frequency wave (RF) and a local oscillator wave (LO) with the resultant output wave at the coaxial terminal being an intermediate frequency, or difference wave. The signals to be mixed would be 180° out of phase. The two signals are each divided equally within the hybrid-T waveguide and are matched in impedance by the transformers 42 and 44 to that of the diodes 46 and 48 and applied thereto.

Figure 7:
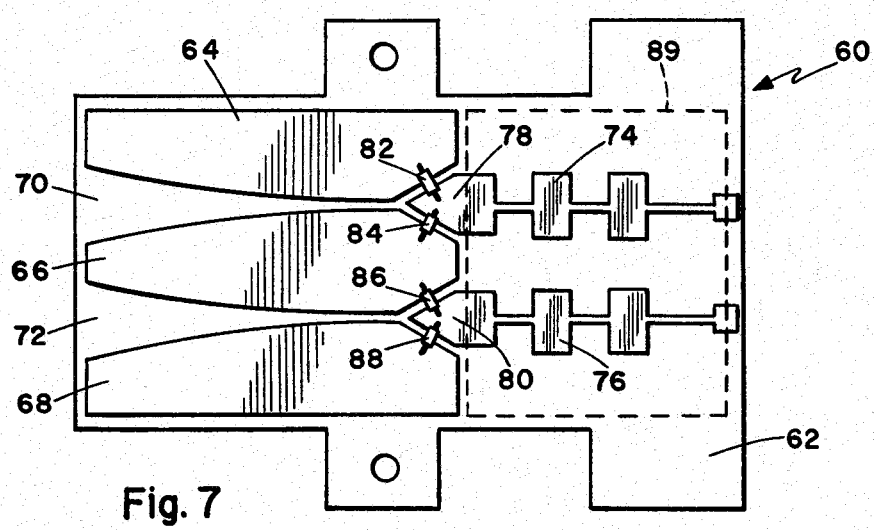
FIG. 7 is a plan view of a double-balanced mixer circuit board.

Referring to FIG. 7, an alternate embodiment of a fin-line circuit pattern for a double-balanced fin-line mixer designated generally by the numeral 60 includes a substrate 62 which is metal cladded forming patterns or areas 64, 66 and 68 having slots 70 and 72 defining slot transformers. This structure is positioned on the top side of the printed circuit pattern including low pass filters 74 and 76 connected by means of respective coplanar junctions through pairs of antiparallel diodes across the slot transformers. The two coplanar junctions 78 and 80 have a forwardly projecting point projecting into a V-slot in the metallization on the top side of the substrate. The coplanar junction 78 is connected by diodes 82 and 84 to the metal areas 64 and 66. The coplanar junction 80 is similarly connected by means of diodes 86 and 88 to the metal areas 66 and 68. A bottom side ground is formed by a metal cladding 89. The fin-line mixer circuit assembly is mounted within the hybrid-T mixer housing as in the previously described embodiment.

Figure 8:
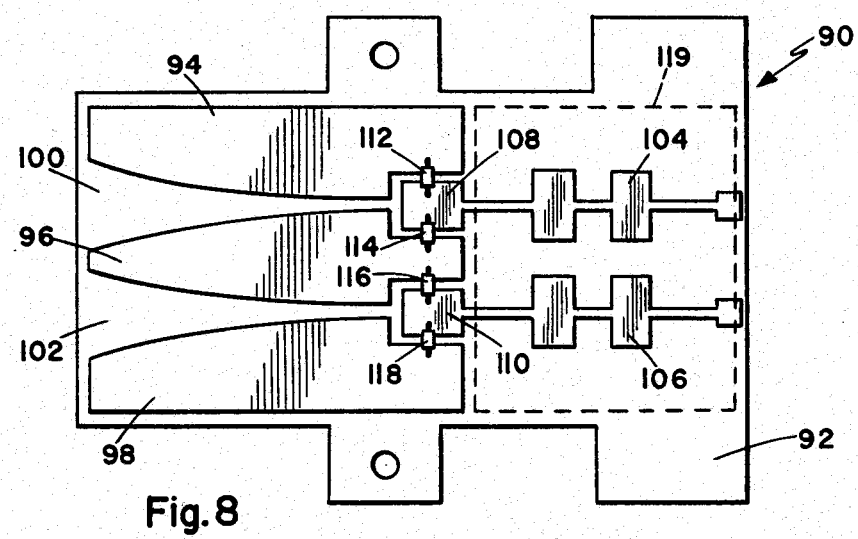
FIG. 8 is a plan view of a further circuit board configuration.

Referring to FIG. 8, a similar double-balanced fin-line mixer is illustrated having slightly different configuration for the coplanar junctions. As illustrated in FIG. 8, a fin-line designated generally by the numeral 90 includes a substrate 92 having pattern of metallic layer 94, 96 and 98 formed thereon with slot transformers 100 and 102 formed in and separate the metal layers. The circuit includes a filter arrangement including low pass filters 104 and 106 connected into the circuit with coplanar junctions 108 and 110 connected by two antiparallel pairs of diodes 112 and 114 and 116 and 118 to the ground layer patterns 94, 96 and 98. The coplanar junctions have a generally rectangular configuration fitting into generally rectangular slot or openings between the ground patterns on the top surface of the substrate. A similar bottom ground pattern or layer 119 is on the under surface of the substrate.

Figure 9:
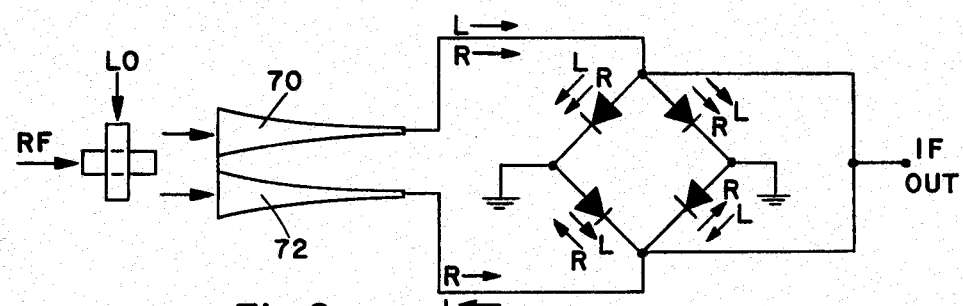
FIG. 9 is a schematic of the double-balanced mixer circuit.

The schematic of these latter two and similar fin-line mixer patterns is illustrated in FIG. 9. The same schematic will represent both circuit patterns and for that reason the numeral references from FIG. 7 will be employed.

In summary, the present invention combines the orthogonal hybrid-T with a fin-line resulting in a compact low cost highly reliable microwave mixer. This arrangement physically provides a wide band impedance transformation from waveguide to fin-line for both RF and LO signals. In addition, it is scalable to the higher frequencies.

Thus, while we have illustrated and described our invention by means of specific embodiments, it is to be understood that numerous changes and modifications may be made therein without departing from the spirit and scope of the invention as defined in the appended claims.

We claim:

1. An orthogonal hybrid fin-line mixer, comprising:
   an elongate housing including two separable half-members, separable substantially along a longitudinal center plane of said housing;
   an inlet waveguide formed in each of said half-members for connecting to a respective signal source;
   a plurality of waveguide channels in said housing which, together with said inlet waveguides, form an orthogonal hybrid-T waveguide structure;
   a planar fin-line substrate mounted in said housing to be substantially co-planar with said center plane and to lie within the respective E-planes of said waveguide channels;
   circuit means on said substrate for mixing signals introduced into said waveguide channels through said input waveguides and providing a mixed output signal;
   an output port mounted on said housing and connected to said circuit means for providing connection to said mixed output signal.

2. An orthogonal hybrid fin-line mixer, comprising:
   an elongate housing including two separable half-members, separable substantially along a longitudinal center plane of said housing;
   an inlet waveguide formed in each of said half-members;
   a pair of waveguide channel portions extending along the length of each half-member which, when said half-members are joined, form, with corresponding portions in the other half-member, a pair of waveguide channels forming, with said input waveguides, an orthogonal hybrid-T waveguide structure;
   a planar fin-line substrate mounted in said housing to be substantially co-planar with said center plane and to lie within the respective E-planes of said waveguide channels;
   circuit means on said substrate for mixing signals introduced into said waveguide channels through said input waveguides and providing a mixed output signal;
   an output port mounted on said housing and connected to said circuit means for providing connection to said mixed output signal.

3. An orthogonal hybrid fin-line mixer, comprising:
   a housing formed from two separable half-members, separable substantially along a longitudinal center plane of said housing;
   a pair of parallel rectangular waveguide channels in said housing separated by a common wall and extending from a common cavity at one end of said housing to the other end of said housing;
   a pair of colinear input waveguides extending in opposite directions from said common cavity and orthogonal to said parallel waveguide channels, each said input waveguide formed in a respective one of said half-members;
   a planar fin-line substrate mounted in said housing to be substantially co-planar with said center plane and to lie within the respective E-planes of said waveguide channels;
   circuit means on said substrate for mixing signals introduced into said waveguide channels through said input waveguides and providing a mixed output signal;
   an output port mounted on said housing and connected to said circuit means for providing connection to said mixed output signal.

4. A hybrid waveguide mixer, comprising:
   an elongate housing having a cavity;
   oppositely-directed, colinearly aligned input waveguides on opposite sides of said housing for conducting microwave energy signals from respective energy sources into the cavity;
   a pair of adjacent waveguide channels disposed substantially in parallel in said housing with corresponding ends of the channels communicating through said cavity with both said input waveguides, each channel for conducting a respective portion of each microwave energy signal from said cavity into said housing;
   a planar fin-line substrate disposed in said housing to extend through and substantially longitudinally bisect said channels;
   electronic circuitry on said substrate and including, for each channel, transformer circuit means for coupling said signal portions from said channel, mixing means connected to said transformer means for mixing said coupled portions, and filter means connected to said mixing means for receiving said mixed portions and providing a mixed, IF signal; and
   an output port mounted on said housing and connected to both said filter means for providing a mixed, IF output.

5. The mixer of claim 4 wherein said housing comprises two elongate half-members, separable substantially along a longitudinal center plane of said housing and having recess means for holding said substrate substantially at said center plane.

6. The mixer of claim 5 wherein said input waveguides are formed in separate ones of said half-members.

7. The mixer of claim 5 wherein each half-member includes a pair of parallel waveguide channel portions extending substantially along the length thereof.

8. The mixer of claim 4 wherein said substrate is disposed to be substantially coplanar with the center planes of respective corresponding transverse propagation fields in said channels.

9. The mixer of claim 4 wherein said mixing means is double-balanced.

10. The mixer of claim 4 wherein said mixing means is single-balanced.

* * * * *